United States Patent
Su et al.

(10) Patent No.: US 7,387,915 B2
(45) Date of Patent: *Jun. 17, 2008

(54) METHOD FOR MANUFACTURING HEAT SINK OF SEMICONDUCTOR DEVICE

(75) Inventors: Yan-Kuin Su, Tainan (TW); Kuan-Chun Chen, Taichung Hsien (TW); Chun-Liang Lin, Tainan Hsien (TW); Jin-Quan Huang, Kaohsiung Hsien (TW); Shu-Kai Hu, Kaohsiung (TW)

(73) Assignee: National Cheng Kung University, Tainan (TW)

( * ) Notice: Subject to any disclaimer, the term of this patent is extended or adjusted under 35 U.S.C. 154(b) by 0 days.

This patent is subject to a terminal disclaimer.

(21) Appl. No.: 11/470,273

(22) Filed: Sep. 6, 2006

(65) Prior Publication Data
US 2007/0298543 A1     Dec. 27, 2007

(30) Foreign Application Priority Data
Jun. 26, 2006    (TW) .............................. 95123021 A

(51) Int. Cl.
*H01L 21/00* (2006.01)
(52) U.S. Cl. .............................. 438/122; 257/E33.075; 257/E23.101
(58) Field of Classification Search ................ 438/122; 257/E33.075, E23.101
See application file for complete search history.

(56) References Cited

U.S. PATENT DOCUMENTS

| 6,627,997 | B1 * | 9/2003 | Eguchi et al. ............... 257/777 |
| 2006/0067054 | A1 * | 3/2006 | Wang et al. ................. 361/704 |
| 2007/0004066 | A1 * | 1/2007 | Wuu et al. .................... 438/29 |
| 2007/0121327 | A1 * | 5/2007 | Chen et al. .................. 362/294 |

* cited by examiner

*Primary Examiner*—Trung Dang

(57) ABSTRACT

A method for manufacturing a heat sink of a semiconductor device is described. In the method, an adhesive tape is provided, wherein the adhesive tape includes a first surface and a second surface on opposite sides, and the first surface of the adhesive tape adheres to a surface of a temporary substrate. At least one semiconductor device is provided, wherein the semiconductor device includes a first side and a second side opposite to the first side, and the first side of the one semiconductor device is pressed and set into a portion of the second surface of the adhesive tape, and the second side of the one semiconductor device is exposed. A thin metal layer is formed on the second side of the semiconductor device and the exposed portion of the second surface of the adhesive tape. A metal heat sink is formed on the thin metal layer. Then, the adhesive tape and the temporary substrate are removed.

20 Claims, 7 Drawing Sheets

METHOD FOR MANUFACTURING HEAT SINK OF SEMICONDUCTOR DEVICE

RELATED APPLICATIONS

The present application is based on, and claims priority from, Taiwan Application Serial Number 95123021, filed Jun. 26, 2006, the disclosure of which is hereby incorporated by reference herein in its entirety.

FIELD OF THE INVENTION

The present invention relates to a method for manufacturing a heat sink of a semiconductor device, and more particularly, to a method for manufacturing a heat sink of an opto-electrical device.

BACKGROUND OF THE INVENTION

When small solid state opto-electrical devices, such as light-emitting diodes (LEDs) or laser diodes (LDs), are applied in a large or small backlight module or illumination module, a lot of opto-electrical devices are needed for the requirements of brightness or illumination of these modules. However, when the opto-electrical devices are operated at high power, the temperature of the module composed of the opto-electrical devices rapidly increases, degrading the operation quality of the module and ultimately burning out the opto-electrical devices.

To resolve this high temperature issue, the opto-electrical module is typically cooled by fans set in the device or by increasing the heat dissipation area. However, regarding setting fans in the device, the vibration caused by the operation of the fans results in the lights flickering, and the fans consume additional power. Regarding increasing the heat dissipation area, one or more heat sinks are usually added onto the opto-electrical device to do so. Although the heat sinks can be composed of metal with high thermal conductivity, glue doped with metal is needed to connect the opto-electrical device to the heat sinks, and the thermal conductivity of the glue is much lower than that of the pure metal. As a result, the heat generated when the module is operated mostly accumulates at the connection interface and makes the heat sinks less effective, so that the opto-electrical device is easily damaged under long-term operation or the opto-electrical device cannot be operated under higher input power. The system volume is also greatly increased by setting fans and increasing the heat dissipation area.

Therefore, with the increasing demand for opto-electrical devices, such as light-emitting diodes and laser diodes, for backlight modules and illumination modules, a technique for manufacturing an opto-electrical device with high heat dissipation efficiency is required.

SUMMARY OF THE INVENTION

In view of the above, with the exception of the flip chip technique and the thermal bonding technique, the opto-electrical device needs to be fixed to the heat sink of the opto-electrical device with glue in conventional opto-electrical device package techniques resulting in poor heat-sinking efficiency of the heat sink. Therefore, one aspect of the present invention is to provide a method for manufacturing a heat sink of a semiconductor device, which directly deposits a heat-sinking metal on a bottom surface of the semiconductor device by plating deposition, electroless plating deposition or evaporation deposition, so that the semiconductor device can adhere and be fixed to the metal heat sink without glue. As a result, the semiconductor device is closely connected with the heat-sinking metal, and the heat-sinking efficiency of the heat-sinking metal can be improved, thereby enhancing the heat-sinking ability of the semiconductor device.

Another aspect of the present invention is to provide a method for manufacturing a heat sink of an opto-electrical device, in which the metal heat sink can be directly easily deposited on a bottom surface of the opto-electrical device with adhesive tape, so that the opto-electrical device is directly and closely connected with the heat-sinking metal, thereby greatly increasing the heat-transmitting area of the opto-electrical device to enhance the heat-transmitting efficiency of the opto-electrical device.

Still another aspect of the present invention is to provide a method for manufacturing a heat sink of an opto-electrical device, which directly connects the opto-electrical device and a metal heat sink, so that the heat generated during the operation of the opto-electrical device can be transmitted rapidly, thereby rapidly lowering the temperature of the opto-electrical device, enhancing the operation quality of the opto-electrical device and prolonging the life of the opto-electrical device.

According to the aforementioned aspects, the present invention provides a method for manufacturing a heat sink of a semiconductor device, comprising: providing an adhesive tape, wherein the adhesive tape includes a first surface and a second surface on opposite sides, and the first surface of the adhesive tape adheres to a surface of a temporary substrate; providing at least one semiconductor device, wherein the at least one semiconductor device includes a first side and a second side opposite to the first side, the first side of the at least one semiconductor device is pressed and set into a portion of the second surface of the adhesive tape to expose the second side of the semiconductor device; forming a thin metal layer on the second side of the at least one semiconductor device and the exposed portion of the second surface of the adhesive tape; forming a metal heat sink on the thin metal layer; and removing the adhesive tape and the temporary substrate.

According to the aforementioned aspects, the present invention further provides a method for manufacturing a heat sink of an opto-electrical device, comprising: providing a temporary substrate; providing an adhesive tape, wherein the adhesive tape includes a first surface and a second surface on opposite sides, and the first surface of the adhesive tape adheres to a surface of the temporary substrate; providing at least one opto-electrical device, wherein the at least one opto-electrical device includes a first side and a second side opposite to the first side, the first side of the at least one opto-electrical device is pressed and set into a portion of the second surface of the adhesive tape to expose the second side of the opto-electrical device; forming a thin metal layer on the second side of the at least one opto-electrical device and the exposed portion of the second surface of the adhesive tape; forming a reflective layer on the thin metal layer; forming a metal heat sink on the reflective layer; and removing the adhesive tape and the temporary substrate.

According to a preferred embodiment of the present invention, a material of the thin metal layer may be Ni, Cr, Ti, or an alloy thereof, a thickness of the thin metal layer is less than about 10 μm, a material of the metal heat sink may be Fe/Ni alloy, Cu, Ni, Al, W, or an alloy thereof, and a thickness of the metal heat sink is greater than about 10 μm.

By directly forming the metal heat sink on the surface of the semiconductor device, the metal heat sink can be in direct contact with and directly connected to the semiconductor device, so that there exists no glue between the metal heat sink and the semiconductor device, thereby heat of the semiconductor device can be rapidly transmitted to the metal heat sink, the heat produced during the operation of the semiconductor device can be rapidly dissipated to further increase the operation stability of the semiconductor device.

BRIEF DESCRIPTION OF THE DRAWINGS

The foregoing aspects and many of the attendant advantages of this invention are more readily appreciated as the same become better understood by reference to the following detailed description, when taken in conjunction with the accompanying drawings, wherein.

DETAILED DESCRIPTION OF THE PREFERRED EMBODIMENT

The present invention discloses a method for manufacturing a heat sink of a semiconductor device, which can make the heat sink directly adhere to and contact with the semiconductor device, thereby greatly enhancing the heat-sinking efficiency of the heat sink and effectively prolonging the life of the semiconductor device. In order to make the illustration of the present invention more explicit, the following description is stated with reference to FIG. 1A to FIG. 7.

Figure 1A:
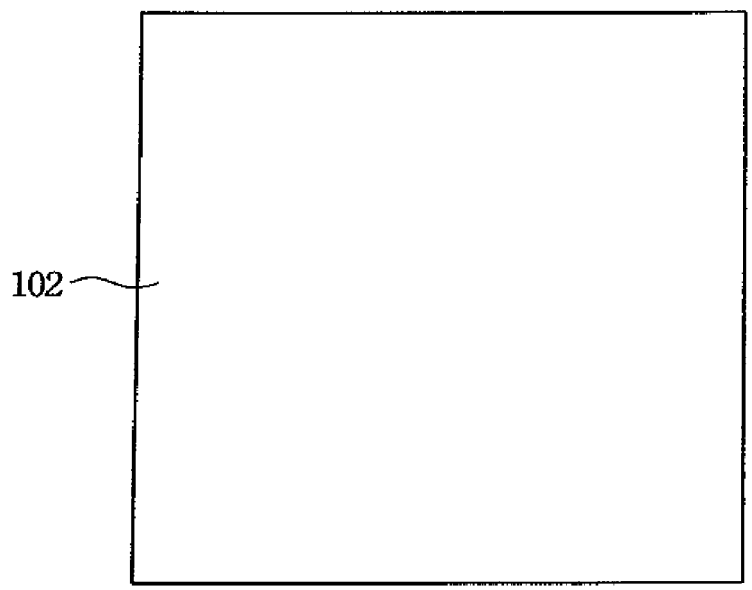
FIG. 1A to FIG. 6 illustrate schematic flow diagrams showing the process for manufacturing a semiconductor device in accordance with a preferred embodiment of the present invention, wherein FIG. 2C are cross-sectional views of two semiconductor devices.
Figure 1B:
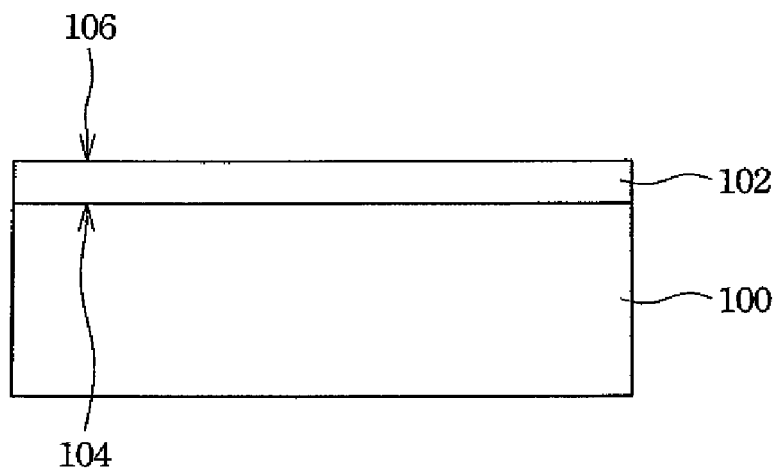

FIG. 1A to FIG. 6 are schematic flow diagrams showing the process for manufacturing a semiconductor device in accordance with a preferred embodiment of the present invention, wherein the schematic flow diagrams includes cross-sectional views and the corresponding top views. Firstly, a temporary substrate 100 and an adhesive tape 102 are provided, wherein the adhesive tape 102 includes surfaces 104 and 106 on opposite sides. The surface 104 of the adhesive tape 102 adheres directly to a surface of the temporary substrate 100, such as shown in FIG. 1A and FIG. 1B, of which FIG. 1A is the top view and FIG. 1B is the corresponding cross-sectional view. The adhesive tape 102 is preferably composed of an acid-proof and alkali-proof material, and the adhesive tape 102 has a thickness greater than about 10 μm. In a preferred embodiment of the present invention, the adhesive tape 102 preferably has a thickness of about 100 μm and is a double-sided adhesive tape, that is, the surface 104 and the surface 106 of the adhesive tape 102 are both adhesive. However, in the present invention, if the adhesive tape 102 is composed of a soft plastic material, the surface 104 might be adhesive while the surface 106 is not adhesive.

Figure 2A:
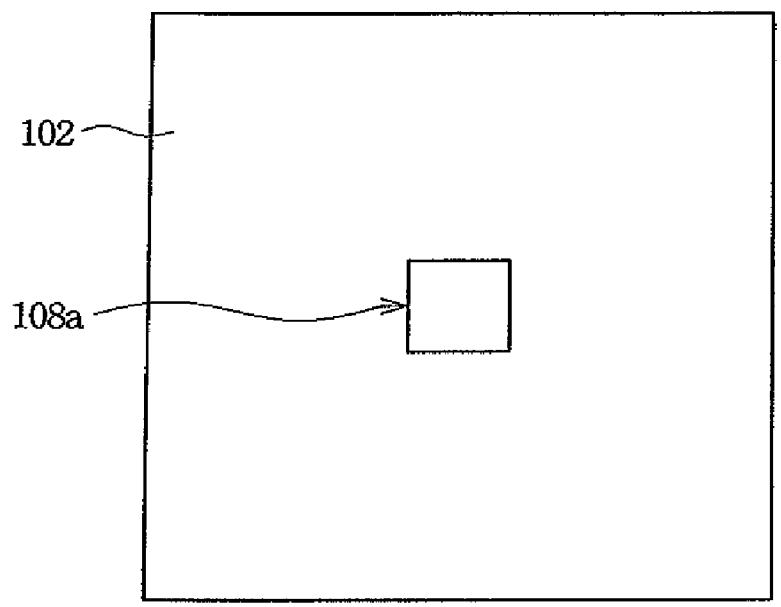
Figure 2B:
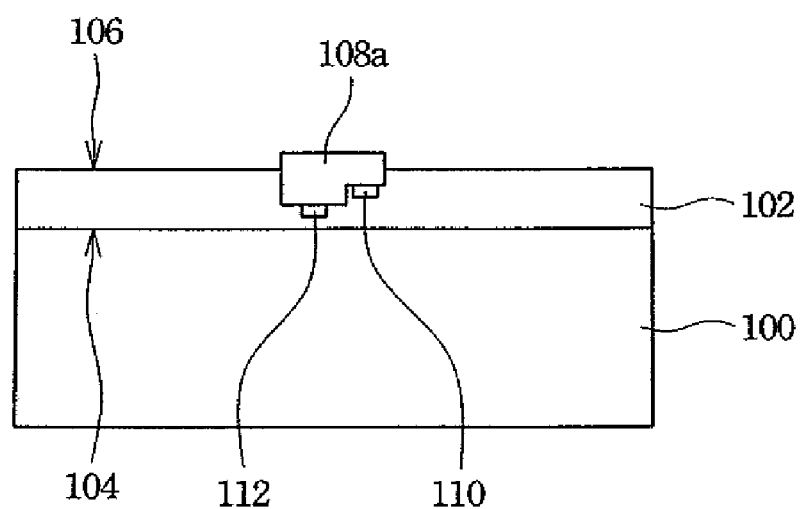
Figure 2C:
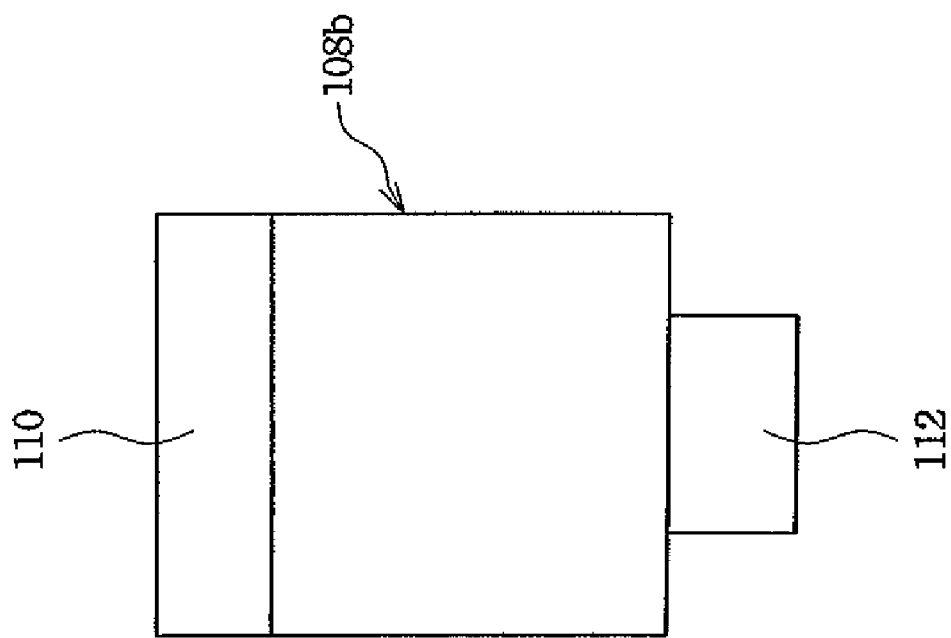
Figure 2C:
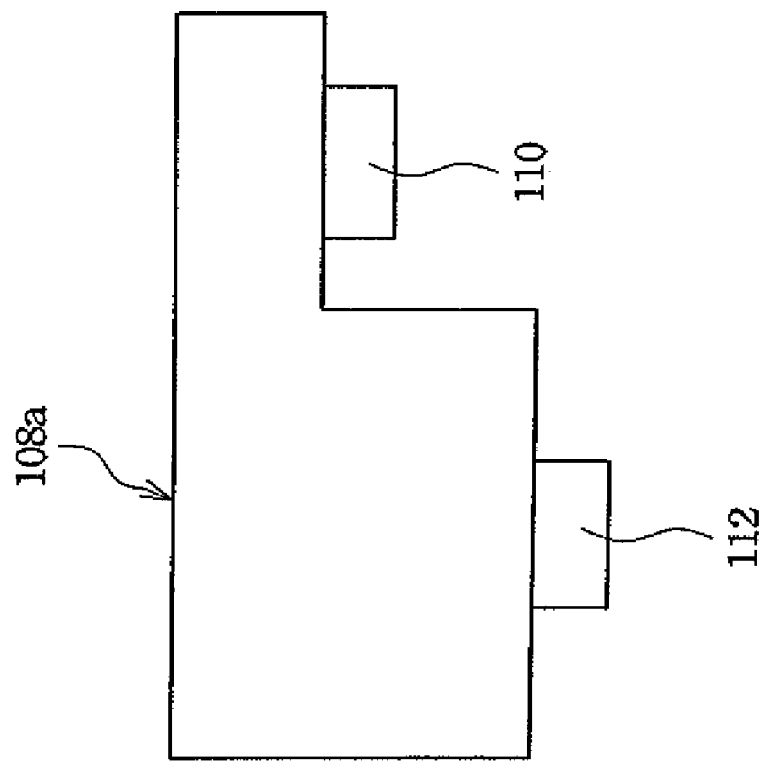

Next, one or more semiconductor devices are provided, wherein the semiconductor devices are composed of compound semiconductor materials, such as GaN-based materials, AlGaInP-based materials, PbS-based materials or SiC-based materials, and the semiconductor devices are, for example, transistors, monolithic ICs, or opto-electrical devices, such as light-emitting diodes or laser diodes. In the present invention, each semiconductor device includes two electrodes of different conductivity types, wherein the electrodes are deposed at the same side or at different sides of the semiconductor device, such as opto-electrical devices 108a and 108b shown in FIG. 2C. The two electrodes 110 and 112 of the opto-electrical device 108a are deposed on the same side of the opto-electrical device 108a; and the two electrodes 110 and 112 of the opto-electrical device 108b are deposed on two opposite sides of the opto-electrical device 108b. When the electrode 110 is N-type, the electrode 112 is P-type; and when the electrode 110 is P-type, the electrode 112 is N-type. In the exemplary embodiment, the opto-electrical device 108a is adapted for the semiconductor device. A side of the opto-electrical device 108a is pressed downward on the surface 106 of the adhesive tape 102 to make the opto-electrical device 108a adhere to or embed into the surface 106 of the adhesive tape 102 and to expose the side of the opto-electrical device 108a opposite to the adhered side, wherein the side of the opto-electrical device 108a pressed into the adhesive tape 102 includes at least one electrode deposed thereon, such as shown in FIG. 2A and FIG. 2B, wherein FIG. 2A is the top view and FIG. 2B is the corresponding cross-sectional view. In the present invention, when many opto-electrical devices 108a are processed at the same time, these opto-electrical devices 108a can be arranged according to the process requirements.

In the present invention, the opto-electrical devices 108a may be GaN-based light-emitting diodes, AlGaInP-based light-emitting diodes, PbS-based light-emitting diodes or SiC-based light-emitting diodes. In other embodiments, the opto-electrical devices 108a may be GaN-based laser diodes, AlGaInP-based laser diodes, PbS-based laser diodes or SiC-based laser diodes.

Figure 3A:
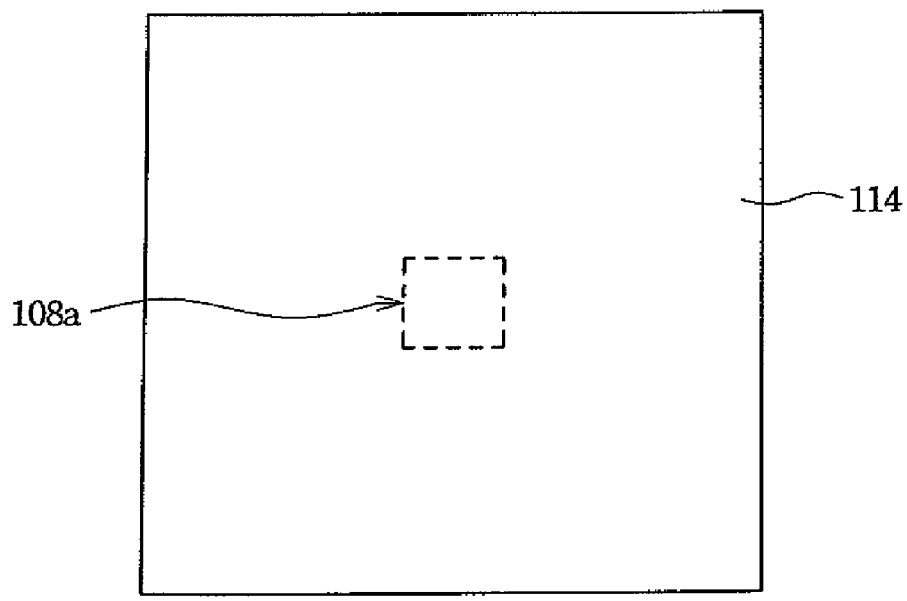
Figure 3B:
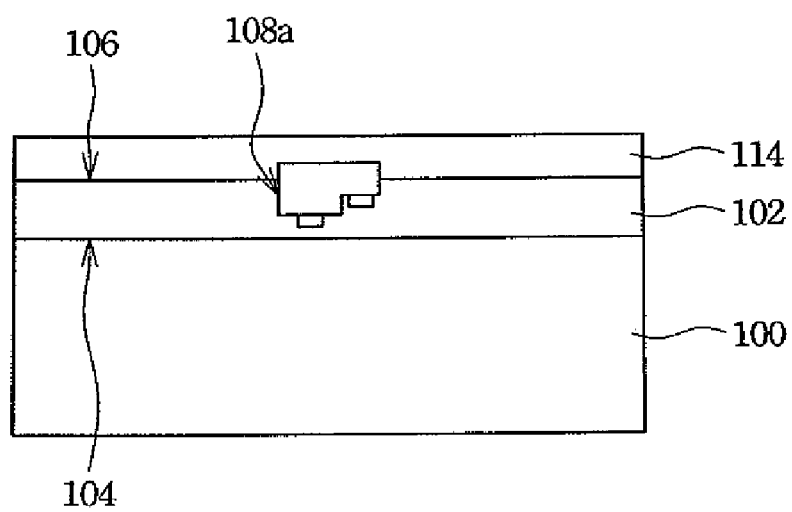

After the opto-electrical device 108a is fixed in the adhesive tape 102, a thin metal layer 114 is directly formed to cover the exposed surface of the opto-electrical device 108a and the exposed region in the surface 106 of the adhesive tape 102 by, for example, an evaporation deposition method, a sputtering deposition method or an electroless plating deposition method, such as shown in FIG. 3A and FIG. 3B, in which FIG. 3A is the top view and FIG. 3B is the corresponding cross-sectional view. The thin metal layer 114 is preferably composed of a metal material of good adhesion, such as Ni, Cr, Ti, or an alloy thereof, to facilitate the deposition of the metal material. In the present invention, the thin metal layer 114 may be composed of a single-layered metal structure, or may be composed of a multi-layered metal structure. A thickness of the thin metal layer 114 is preferably less than about 10 μm. In an exemplary embodiment, the thickness of the thin metal layer 114 is about 10 nm.

Figure 4A:
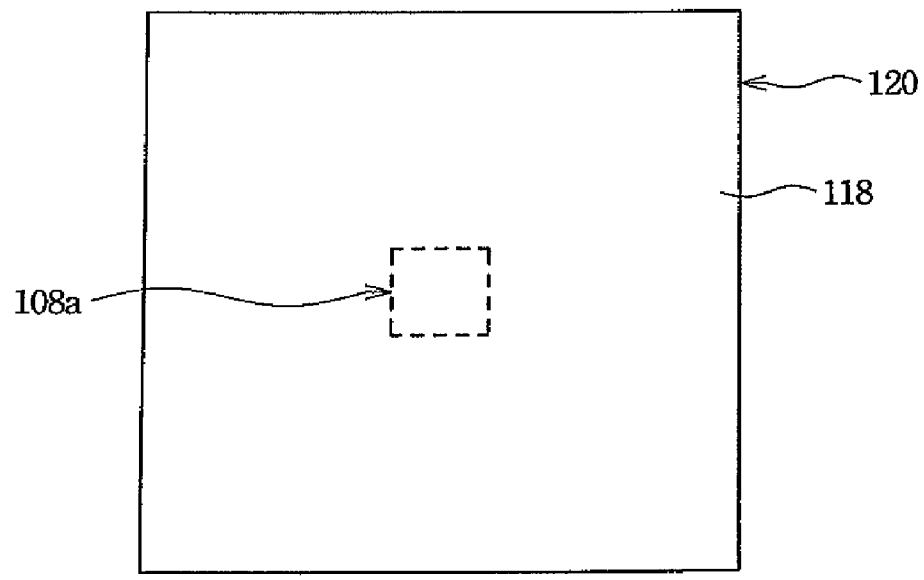
Figure 4B:
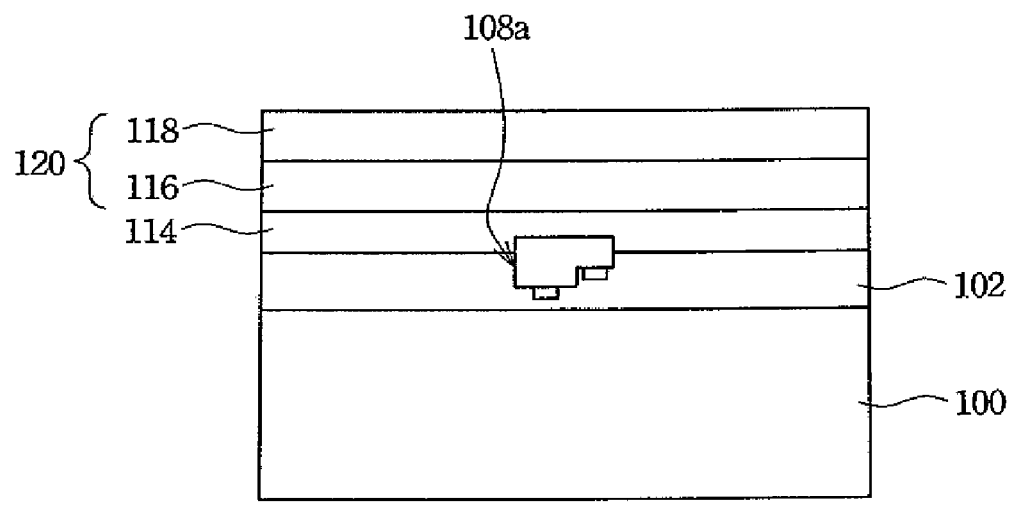

Then, a heat sink of the semiconductor device may be formed directly, or a light-reflecting structure is selectively formed on the semiconductor device according to the product needs, such as the semiconductor device is an opto-electrical device. A reflective layer 120 is formed to cover the thin metal layer 114 on the opto-electrical device 108a by, for example, an evaporation deposition method, a sputtering deposition method, an electroless plating deposition method or an electro plating deposition method, wherein the reflective layer 120 is preferably composed of a metal material of good reflectivity, such as Ag, Pt, Al, Au, Ni, Ti, or an alloy thereof, and the reflective layer 120 may be composed of a single-layered metal structure or a multi-layered metal structure. In other embodiments of the present invention, a stacked structure is composed of several reflective material layers of low electric conductivity that may also be adapted as the reflective layer 120. As shown in FIGS. 4A and 4B, in the preferred embodiment, the reflective layer 120 is composed of a silver film 116 and a gold film 118 stacked on the thin metal layer 114 in sequence, wherein a thickness of the silver film 116 is about 300 nm, and a thickness of the gold film 118 is about 150 nm. In the present invention, a thickness of the reflective layer 120 is preferably less than about 10 μm.

Figure 5A:
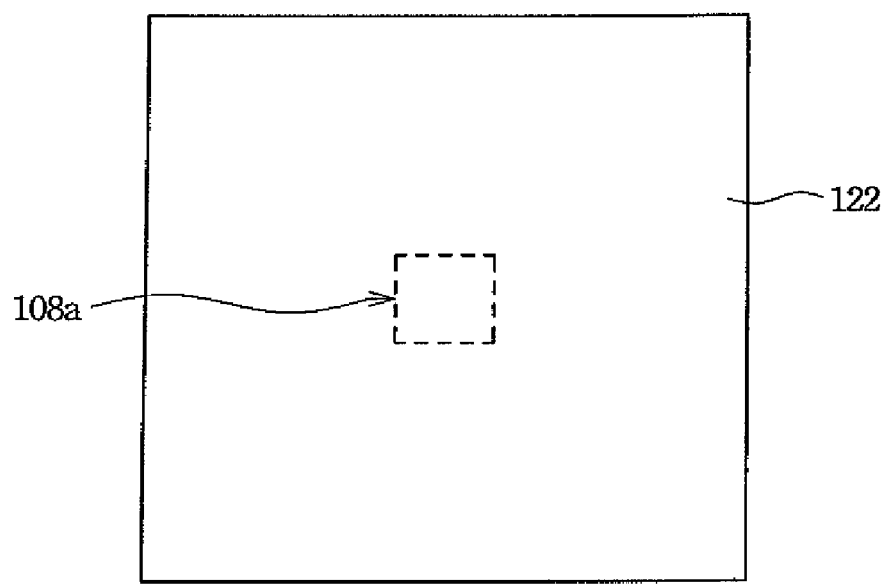
Figure 5B:
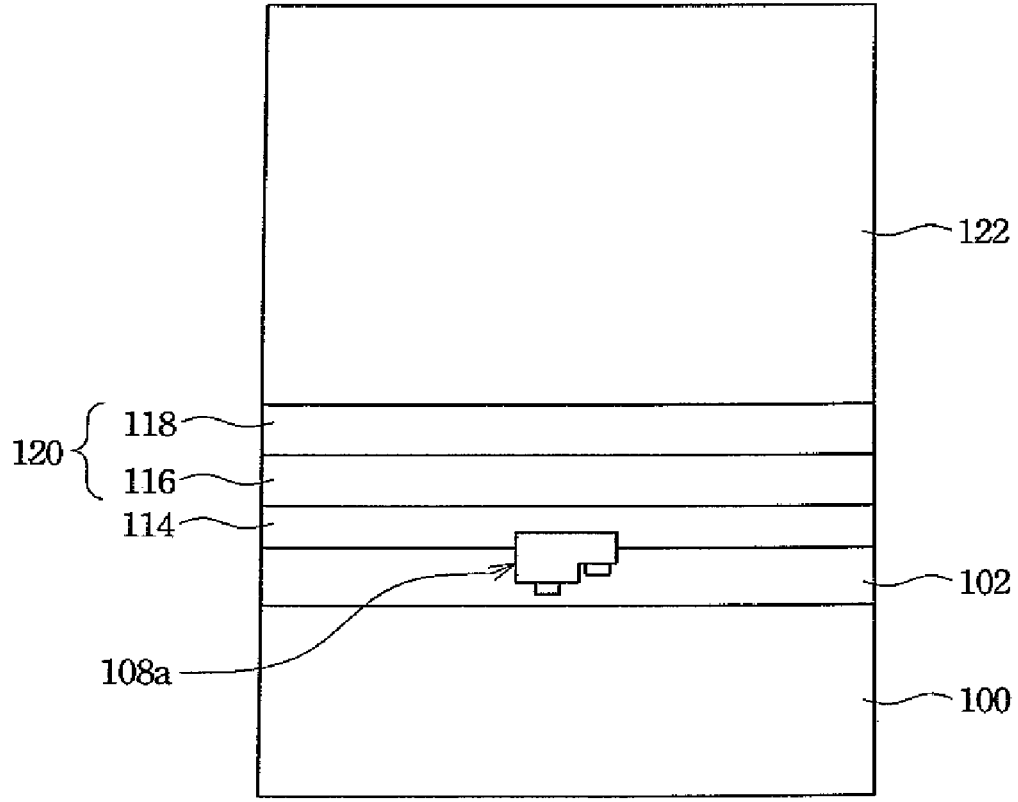

Next, a thicker metal layer is formed on the reflective layer 120 by, for example, a plating method or an electroless plating method and is used as a metal heat sink 122, such as shown in FIG. 5A and FIG. 5B, in which FIG. 5A is the top view and FIG. 5B is the corresponding cross-sectional view. Because the metal heat sink 122 is formed by a plating method or an electroless plating method in the present invention, the metal heat sink 122 is substantially grown on the reflective layer 120. In the present invention, the metal heat sink 122 is preferably composed of a metal with good thermal conductivity, such as Fe/Ni alloy, Cu, Ni, Al, W, or an alloy thereof. The metal heat sink 122 is generally thicker and preferably has a thickness greater than about 10 μm for larger heat conduction. In an embodiment of the present invention, a thickness of the metal heat sink 122 is preferably about 3 mm.

One feature of the present invention is that the thin metal layer is initially formed by an evaporation deposition method, a sputtering deposition method or an electroless plating deposition method and is used as the base for plating or electroless plating the metal heat sink, and a reflective layer is selectively formed according to the needs of the semiconductor device for increasing the light extraction efficiency of the opto-electrical device. With only one single adhesive tape used, the metal heat sink can be formed on the bottom surface of the semiconductor device when the thin metal layer and the metal heat sink are formed. As a result, the present process is very simple, and the standard process equipment can still be used, thereby preventing increasing the process cost. Furthermore, there is no glue between the semiconductor device and the metal heat sink, thereby greatly increasing the heat-transmitting area and the heat-transmitting speed of the semiconductor device.

Figure 6:
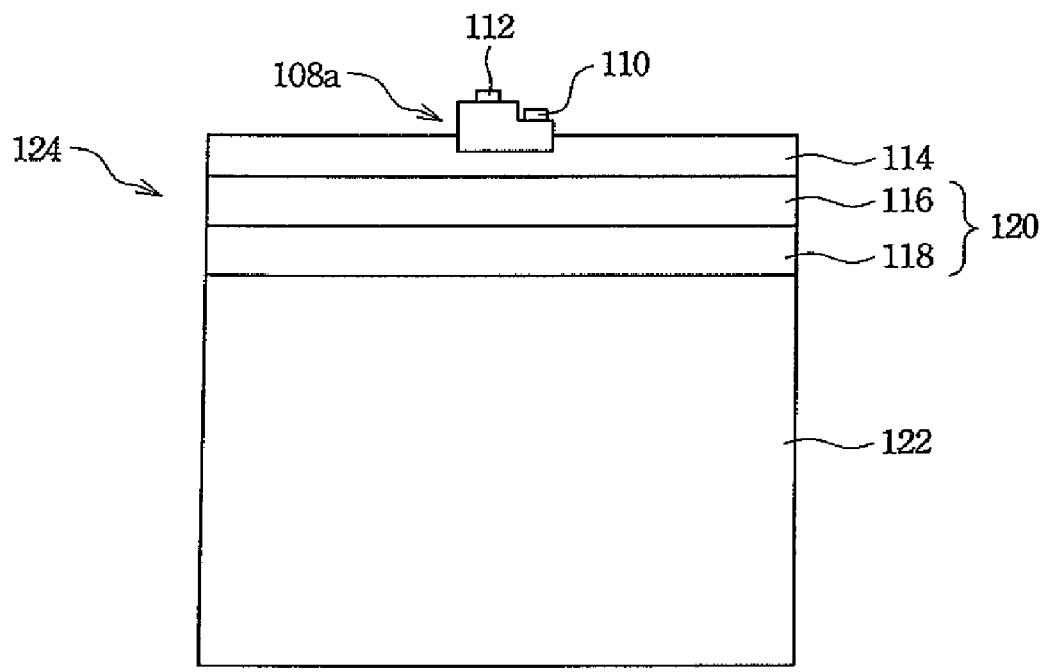

After the metal heat sink 122 is formed, the adhesive tape 102 and the temporary substrate 100 are removed to complete the fabrication of the light-emitting device 124, such as shown in FIG. 6. Because the thin metal layer 114 and the opto-electrical device 108a adhere to the temporary substrate 100 by the adhesive tape 102, the metal heat sink 122, the thin metal layer 114, the reflective layer 120 and the opto-electrical device 108a can be separated from the temporary substrate 100 easily.

Figure 7:
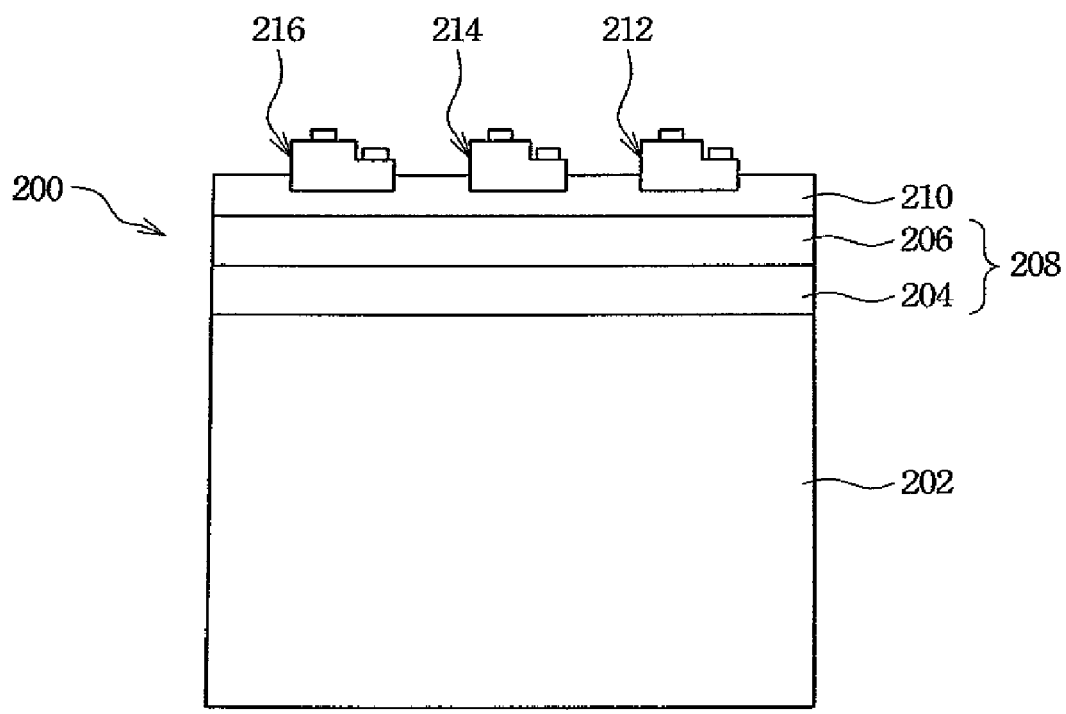
FIG. 7 is a cross-sectional view of an opto-electrical device in accordance with another preferred embodiment of the present invention.

In the present invention, the metal heat sink can be cut into several units of a required size according to the application or heat-sinking requirement. Referring to FIG. 7, which is a cross-sectional view of an opto-electrical device in accordance with another preferred embodiment of the present invention. After cutting, an opto-electrical device 200 fabricated by the method of the present invention includes a blue light-emitting diode 212, a green light-emitting diode 214 and a red light-emitting diode 216 embedded in a thin metal layer 210, and the thin metal layer 210 is deposed on the metal heat sink 202. A reflective layer 208 is further set between the thin metal layer 210 and the metal heat sink 202 for increasing the light extraction efficiency of the blue light-emitting diode 212, the green light-emitting diode 214 and the red light-emitting diode 216. The reflective layer 208 is composed of a gold film 204 and a silver film 206 stacked on the metal heat sink 202 in sequence. The opto-electrical device may be provided for a backlight module or an illumination source.

According to the aforementioned description, one advantage of the present invention is that a method for manufacturing a metal heat sink of a semiconductor device of the present invention directly deposits a heat-sinking metal on a bottom surface of the semiconductor device by plating deposition, electroless plating deposition or evaporation deposition, so that the semiconductor device can adhere and be fixed to the metal heat sink without glue. Therefore, the heat-sinking efficiency of the heat-sinking metal can be improved, thereby enhancing the heat-sinking ability of the semiconductor device.

According to the aforementioned description, another advantage of the present invention is that the metal heat sink can be directly deposited on a bottom surface of the opto-electrical device with the assistanc of adhesive tape easily, so that the heat-transmitting area of the opto-electrical device between the opto-electrical device and the metal heat sink can be greatly increased to enhance the heat-transmitting efficiency of the opto-electrical device. As a result, the heat-sinking problem of the opto-electrical device during operation can be effectively improved.

According to the aforementioned description, still another advantage of the present invention is that in a method for manufacturing a metal heat sink of an opto-electrical device of the present invention, the opto-electrical device can be directly connected with a metal heat sink, so that the heat generated during the operation of the opto-electrical device can be transmitted rapidly, thereby effectively lowering the temperature of the opto-electrical device, enhancing the operation quality of the opto-electrical device and prolonging the life of the opto-electrical device.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A method for manufacturing a heat sink of a semiconductor device, comprising:
   providing an adhesive tape, wherein the adhesive tape includes a first surface and a second surface on opposite sides, and the first surface of the adhesive tape adheres to a surface of a temporary substrate;
   providing at least one semiconductor device, wherein the at least one semiconductor device includes a first side and a second side opposite to the first side, the first side of the at least one semiconductor device is pressed and set into a portion of the second surface of the adhesive tape to expose the second side of the semiconductor device;
   forming a thin metal layer on the second side of the at least one semiconductor device and the exposed portion of the second surface of the adhesive tape;
   forming a metal heat sink on the thin metal layer; and
   removing the adhesive tape and the temporary substrate.

2. The method for manufacturing a heat sink of a semiconductor device according to claim 1, wherein the first surface and the second surface of the adhesive tape are both adhesive.

3. The method for manufacturing a heat sink of a semiconductor device according to claim 1, wherein the adhesive tape is composed of an acid-proof and alkali-proof material.

4. The method for manufacturing a heat sink of a semiconductor device according to claim 1, wherein a thickness of the adhesive tape is greater than about 10 μm.

5. The method for manufacturing a heat sink of a semiconductor device according to claim 1, wherein the at least one semiconductor device is at least one opto-electrical device.

6. The method for manufacturing a heat sink of a semiconductor device according to claim 5, wherein the at least one semiconductor device is selected from the group consisting of at least one light-emitting diode and at least one laser diode.

7. The method for manufacturing a heat sink of a semiconductor device according to claim 5, wherein the at least one semiconductor device is composed of a compound semiconductor material, and the compound semiconductor material is a GaN-based material, an AlGaInP-based material, a PbS-based material or a SiC-based material.

8. The method for manufacturing a heat sink of a semiconductor device according to claim 5, wherein the at least one semiconductor device has a first conductivity type electrode and a second conductivity type electrode with different conductivity types, and the first conductivity type electrode and the second conductivity type electrode are respectively deposed on the first side and the second side of the at least one semiconductor device.

9. The method for manufacturing a heat sink of a semiconductor device according to claim 5, wherein the at least one semiconductor device has a first conductivity type electrode and a second conductivity type electrode with different conductivity types, and the first conductivity type electrode and the second conductivity type electrode are deposed on the first side of the at least one semiconductor device.

10. The method for manufacturing a heat sink of a semiconductor device according to claim 1, wherein the at least one semiconductor device is at least one transistor or at least one monolithic IC.

11. The method for manufacturing a heat sink of a semiconductor device according to claim 1, wherein the thin metal layer is composed of a multi-layered metal structure.

12. The method for manufacturing a heat sink of a semiconductor device according to claim 1, wherein a material of the thin metal layer is Ni, Cr, Ti, or an alloy thereof.

13. The method for manufacturing a heat sink of a semiconductor device according to claim 1, wherein a thickness of the thin metal layer is less than about 10 μm.

14. The method for manufacturing a heat sink of a semiconductor device according to claim 1, wherein the step of forming the thin metal layer is performed by an evaporation deposition method, a sputtering deposition method or an electroless plating deposition method.

15. The method for manufacturing a heat sink of a semiconductor device according to claim 1, wherein a material of the metal heat sink is Fe/Ni alloy, Cu, Ni, Al, W, or an alloy thereof.

16. The method for manufacturing a heat sink of a semiconductor device according to claim 1, wherein a thickness of the metal heat sink is greater than about 10 μm.

17. The method for manufacturing a heat sink of a semiconductor device according to claim 1, wherein the step of forming the metal heat sink is performed by a plating method or an electroless plating method.

18. A method for manufacturing a heat sink of an opto-electrical device, comprising:
    providing a temporary substrate;
    providing an adhesive tape, wherein the adhesive tape includes a first surface and a second surface on opposite sides, and the first surface of the adhesive tape adheres to a surface of the temporary substrate;
    providing at least one opto-electrical device, wherein the at least one opto-electrical device includes a first side and a second side opposite to the first side, the first side of the at least one opto-electrical device is pressed and set into a portion of the second surface of the adhesive tape to expose the second side of the opto-electrical device;
    forming a thin metal layer on the second side of the at least one opto-electrical device and the exposed portion of the second surface of the adhesive tape;
    forming a reflective layer on the thin metal layer;
    forming a metal heat sink on the reflective layer; and
    removing the adhesive tape and the temporary substrate.

19. The method for manufacturing a heat sink of an opto-electrical device according to claim 18, wherein the step of forming the reflective layer is performed by an evaporation deposition method, a sputtering deposition method, an electroless plating deposition method or an electro plating deposition method.

20. The method for manufacturing a heat sink of an opto-electrical device according to claim 18, wherein a material of the reflective layer is Ag, Pt, Al, Au, Ni, Ti, or an alloy thereof.

* * * * *